United States Patent
Chung et al.

(10) Patent No.: US 11,222,864 B2
(45) Date of Patent: Jan. 11, 2022

(54) SEMICONDUCTOR WAFER PROCESSING ARRANGEMENT EMPLOYING AN ADHESIVE SHEET AND METHOD FOR PROCESSING A SEMICONDUCTOR WAFER

(71) Applicant: Amerasia International Technology, Inc., Princeton Junction, NJ (US)

(72) Inventors: Kevin Kwong-Tai Chung, Princeton, NJ (US); Frederick Lo, Green Brook, NJ (US)

(73) Assignee: Amerasia International Technology, Princeton Junction, NJ (US)

( * ) Notice: Subject to any disclaimer, the term of this patent is extended or adjusted under 35 U.S.C. 154(b) by 0 days.

(21) Appl. No.: 16/773,001

(22) Filed: Jan. 27, 2020

(65) Prior Publication Data
US 2020/0243481 A1    Jul. 30, 2020

Related U.S. Application Data

(60) Provisional application No. 62/918,407, filed on Jan. 28, 2019.

(51) Int. Cl.
*H01L 23/00* (2006.01)
*H01L 21/687* (2006.01)

(52) U.S. Cl.
CPC .......... *H01L 24/94* (2013.01); *H01L 21/687* (2013.01); *H01L 24/29* (2013.01); *H01L 24/83* (2013.01); *H01L 2224/29* (2013.01)

(58) Field of Classification Search
CPC .......... H01L 21/67132; H01L 21/687; H01L 21/6836; H01L 24/94; H01L 2224/8185; H01L 2224/81855; H01L 2224/81856; H01L 2224/818; H01L 2224/1319; H01L 2224/13191; H01L 2224/1369; H01L 2224/13691; H01L 2224/2919;
(Continued)

(56) References Cited

U.S. PATENT DOCUMENTS 6,682,990 B1 * 1/2004 Iwane ............... H01L 31/0504
                                                    438/458
6,938,783 B2   9/2005 Chung
(Continued)

FOREIGN PATENT DOCUMENTS

WO    2015/190477    12/2015

OTHER PUBLICATIONS

International Searching Authority/US, "International Search Report and Written Opinion" International Application No. PCT/US2020/015176, dated Apr. 14, 2020, 14 pgs.
(Continued)

*Primary Examiner* — Khiem D Nguyen
(74) *Attorney, Agent, or Firm* — Clement A. Berard, Esq.; Dann, Dorfman, Herrell & Skillman, PC

(57) ABSTRACT

A semiconductor wafer support arrangement and method for processing a semiconductor wafer including an adhesive sheet may comprise: a layer of wafer supporting adhesive that has certain characteristics that permit wafer processing, e.g., wafer thinning, and removal of the processed wafer in condition for use without cleaning. The carrier or substrate for the wafer processing may be reusable, and the adhesive sheet may have plural layers and may include a flexible substrate.

34 Claims, 6 Drawing Sheets

(58) Field of Classification Search
CPC ... H01L 2224/29191; H01L 2224/2969; H01L 2224/29691; H01L 21/68757; H01L 21/6835; C09J 2203/30; C09J 2203/326
USPC .......................................................... 257/773
See application file for complete search history.

(56) References Cited

U.S. PATENT DOCUMENTS

| | | | |
|---|---|---|---|
| 7,458,472 | B2 | 12/2008 | Chung |
| 7,883,991 | B1 | 2/2011 | Wu et al. |
| 7,982,296 | B2* | 7/2011 | Nuzzo ............... H01L 29/78681 257/679 |
| 9,202,755 | B2* | 12/2015 | Moriyama ............... H01L 24/16 |
| 2002/0187589 | A1* | 12/2002 | Tsujimoto ......... H01L 21/67132 438/118 |
| 2003/0031876 | A1* | 2/2003 | Obeng ................. B24B 37/042 428/423.1 |
| 2005/0167866 | A1* | 8/2005 | Hennessey ........... B29D 17/007 264/1.33 |
| 2005/0170546 | A1* | 8/2005 | Patel ..................... B82Y 30/00 438/48 |
| 2005/0233547 | A1* | 10/2005 | Noda .................... B32B 43/006 438/459 |
| 2011/0308739 | A1* | 12/2011 | McCutcheon .... H01L 21/67092 156/766 |
| 2012/0100697 | A1* | 4/2012 | Yasuda .................. H01L 24/29 438/464 |
| 2015/0368833 | A1* | 12/2015 | Farah ..................... B23K 26/53 117/58 |
| 2016/0240523 | A1* | 8/2016 | Takamoto ............... H01L 25/50 |
| 2018/0158735 | A1* | 6/2018 | Huang .................. H01L 23/544 |
| 2019/0148335 | A1* | 5/2019 | Bayless ................ H01L 23/562 257/798 |
| 2019/0341364 | A1* | 11/2019 | Fathi ....................... B32B 25/14 |

OTHER PUBLICATIONS

Chung, K. et al., "Temporary bonding adhesive for thin wafer handling", SemiCon Taiwan, Sep. 9, 2016, 31 pages.

AI Technology, Inc., "AI Technology Product Brochure", Jan. 15, 2019, 24 pages, https://www.aitechnology.com/wp-content/uploads/AIT_Brochure_300dpi2_Reduced.pdf.

Yole Developpement, "Thin Wafers, Temporary Bonding Equipment & Materials Market" Lyon, France, © 2012, 11 pp., https://www.slideshare.net/Yole_Developpement/yole-thin-wafer-reportsampleseptember2012.

Yess, K., "Temporary Bonding: Enabling the Next Generation of Ultrathin Wafers", Jun. 11, 2018, 6 pages, https://semiengineering.com/temporary-bonding-enabling-the-next-generation-of-ultrathin-wafers/.

Chung, K., "Wafer level application of tack-free die-attach adhesive film", U.S. Appl. No. 09/706,636, filed Nov. 6, 2000, 39 pages—AI Technology Proprietary.

Uhrmann, T. et al., "Laser debonding enables advanced thin wafer processing", Jan. 2013, 6 pages, https://www.researchgate.net/publication/261831524_Laser_debonding_enables_advanced_thin_wafer_processing.

Pizzagalli, Amandine, "Bonding and Lithography Equipment Market for More than Moore devices—Sample 2018", © 2018, 40 pages, https://www.systemplus.fr/wp-content/uploads/2018/11/YD-18038-Bonding-and-Lithography-Equipment-Market-for-More-than-Moore-Devices_sample.pdf.

Hermanowski, James, et al., "The Role of Wafer Bonding in 3D Integration and Packaging", published 2010, 7 pages, https://www.semanticscholar.org/paper/Major-3-DIC-Process-Flows-Process-IC-Wafer-Step-%23-1-Hermanowski-George/754d2bf453230699a5a4060c014151e2d7914dbc.

AI Technology, Inc., "Wafer Processing Adhesive WPA-PR-200 Product Data Sheet", Ver. 2.1, Jan. 16, 2019, 1 page.

AI Technology, Inc., "Wafer Processing Adhesive WPA-PR-270 Product Data Sheet", Ver. 2.0, Jan. 16, 2019, 1 page.

AI Technology, Inc., "Wafer Processing Adhesive WPA-PR-330 Product Data Sheet", Ver. 2.1, Jan. 23, 2019, 1 page.

AI Technology, Inc., "Backgrinding-Dicing Film WPA-TR-200 Product Data Sheet", Rev. 2.0, Jul. 26, 2019, 1 page.

AI Technology, Inc., "Wafer Processing Adhesive WPA-UVR-200 Product Data Sheet", Ver. 2.1, Nov. 7, 2019, 1 page.

AI Technology, Inc., "Backgrinding-Dicing Film WPA-TR-270 Product Data Sheet", Rev. 2.0, Jul. 26, 2019, 1 page.

AI Technology, Inc., "Wafer Processing Adhesive WPA-UVR-270 Product Data Sheet", Ver. 2.1, Mar. 21, 2019, 1 page.

AI Technology, Inc., "Wafer Processing Adhesive WPA-PR-UVR-200-CF Product Data Sheet", Ver. 2.1, Jan. 28, 2019, 1 page.

AI Technology, Inc., "Wafer Processing Adhesive WPA-PR-TR-200-CF Product Data Sheet", Ver. 2.0, Jan. 25, 2019, 1 page.

AI Technology, Inc., "Wafer Processing Adhesive WPA-PR-UVR-270-CF Product Data Sheet", Ver. 2.1, Jan. 28, 2019, 1 page.

AI Technology, Inc., "Wafer Processing Adhesive WPA-PR-TR-270-CF Product Data Sheet", Ver. 2.0, Jan. 25, 2019, 1 page.

AI Technology, Inc., "Wafer Processing Adhesive WPA-TL-330 Product Data Sheet", Rev. G, Oct. 19, 2016, 1 page.

\* cited by examiner

SEMICONDUCTOR WAFER PROCESSING ARRANGEMENT EMPLOYING AN ADHESIVE SHEET AND METHOD FOR PROCESSING A SEMICONDUCTOR WAFER

This Application claims the benefit of U.S. Provisional Patent Application No. 62/918,407 filed Jan. 28, 2019 and entitled "Temporary Bonding Materials and Solutions Requiring No Rinse Cleaning Post High Temperature Processes," which is hereby incorporated herein by reference in its entirety.

The present invention relates to processing semiconductor wafers and, in particular, to a system and method therefor.

For decades integrated circuits (IC) have been on a path of continuous reduction of the size of features thereof concomitantly with a continuous increase in the size of the semiconductor wafers processed and of the number and complexity of the circuitry constructed thereon for each IC chip. Each step to smaller features and larger wafers has raised its own set of technical challenges for chip designers and process engineers.

With such increasing circuit density and increased operating frequency, the electrical losses and heat generated per unit area of the IC semiconductor chips has also grown, so that heat removal, e.g., thermal design, has also become of greater concern and challenge. Part of the solution to thermal issues has been to thin the wafers, e.g., by grinding to reduce thickness, to reduce the thermal resistance between the circuitry on one face of the IC chip to the heat removal from the opposing surface thereof. Where three-dimensional integration is advancing, thinned wafers and chips allow greater via density which also tends to aid thermal transfer.

Thin semiconductor wafers, e.g., e.g., those under 100 Å $\mu$m thick, ultra-thin semiconductor wafers, e.g., those under 40 Å $\mu$m thick, and the chips separated therefrom, are more fragile, less stable and more vulnerable to stress, thereby being more prone to breaking and warping, both during wafer grinding and subsequent processing. One published report predicted that in 2017, most of the 12 inch diameter wafers will be about 200 Å $\mu$m thick for logic circuit applications and about 10-99 Å $\mu$m thick for memory, interposers and power devices.

Accordingly, special thin wafer handling processes and/or temporary bonding has become necessary to maintain yield, especially where wafers are processed on both surfaces and/or have high feature topographies. Temporary wafer bonding processes are predicted to likely come into greater use to provide additional wafer support as wafers get thinner, and require temporary bonding materials that are strong enough to withstand the rigors of post processing, e.g., grinding and other wafer thinning techniques, while remaining easy to remove afterwards.

Temporary bonding materials must also be able to resist high temperature and other process environments, e.g., metalization, etching and grinding. In addition, the carrier material should be stable and able to withstand multiple uses including post-processing, desirably for tens of times, although known present carriers are not. Conventional temporary bonding materials are released, e.g., by melting the temporary bonding material, mechanically separating the wafer from the carrier, and rinsing away residue. Another conventional method uses a two layer adhesive wherein the adhesive layer adjacent the wafer is sensitive to laser ablation or decomposition, and after removal of the wafer the layer adjacent the carrier can be peeled away and residue rinsed away.

Thus it appears that there is a need for temporary bonding materials and processes that can provide repeatable and multiple uses over the rigors of many usage cycles.

Accordingly, a semiconductor wafer support arrangement for processing a semiconductor wafer including an adhesive sheet may comprise: a layer of wafer supporting adhesive supported by a substrate, the wafer supporting adhesive thereof having at least 100 gm/25 mm peel strength and/or at least 10 psi die shear at a temperature of about 20-50° C.; wherein the wafer supporting adhesive withstands exposure to a temperature of about 200° C. or higher for at least 3 minutes without decomposition; and has a stronger adhesion to the substrate than to a semiconductor wafer; wherein the wafer supporting adhesive outgasses less than about 0.5% by weight under a high vacuum; wherein the layer of adhesive leaves substantially 0% residual adhesive on the semiconductor wafer after removal therefrom; and where the wafer support arrangement is for use with a semiconductor wafer having features of up to a given height on a front surface thereof to be in contact with the wafer supporting adhesive, the layer of wafer supporting adhesive has a thickness that is more than about 1.5 times the given height of the features of the semiconductor wafer; the semiconductor wafer support arrangement wherein the substrate is formed of a material that is dimensionally stable at a temperature of about 200° C. or higher with a total thickness variation of less than about 5 microns and (a) the substrate is flexible and has flatness sufficient to stay on a holding chuck having a surface flatness tolerance of less than about 5 microns; and/or (b) the wafer supporting adhesive has stronger adhesion to the substrate than to the semiconductor wafer.

Further, a semiconductor wafer support arrangement for processing a semiconductor wafer including an adhesive sheet may comprise: a layer of wafer supporting adhesive supported by a substrate, the wafer supporting adhesive thereof having at least 100 gm/25 mm peel strength and/or at least 10 psi die shear at a temperature of about 20-50° C.; wherein the wafer supporting adhesive withstands exposure to a temperature of about 200° C. or higher for at least 3 minutes without decomposition; and has a stronger adhesion to the substrate than to a semiconductor wafer; wherein the wafer supporting adhesive outgasses less than about 0.5% by weight under a high vacuum; wherein the layer of adhesive leaves substantially 0% residual adhesive on the semiconductor wafer after removal therefrom; and where the wafer support arrangement is for use with a semiconductor wafer having features of up to a given height on a front surface thereof to be in contact with the wafer supporting adhesive, the layer of wafer supporting adhesive has a thickness that is more than about 1.5 times the given height of the features of the semiconductor wafer; the semiconductor wafer support arrangement wherein the substrate is formed of a material that is dimensionally stable at a temperature of about 200° C. or higher with a total thickness variation of less than about 5 microns and includes a rigid carrier or a dimensionally stable flexible carrier, and wherein: (a) the wafer supporting adhesive is a single layer that releases from the semiconductor wafer when exposed to a predetermined amount of thermal and/or UV energy, or (b) the wafer supporting adhesive has plural layers of which the layer facing the semiconductor wafer releases from the semiconductor wafer when exposed to a predetermined amount of thermal and/or UV energy, or (c) the wafer supporting adhesive has mechanical strength and flexibility at ambient temperature after processing the semiconductor wafer to release from the semiconductor wafer by peeling.

In addition, a method including the wafer processing adhesive sheet for processing a semiconductor wafer may comprise: obtaining a semiconductor wafer having a back side and having front side on which electronic circuits and/or other features may be formed; attaching the front side of the semiconductor wafer to a wafer processing adhesive side of the adhesive sheet; when the adhesive sheet does not include a substrate, attaching the opposite side thereof to a carrier substrate; processing the back side of the semiconductor wafer; and releasing the semiconductor wafer from the adhesive sheet, or releasing the carrier substrate from the adhesive sheet and releasing the semiconductor wafer from the adhesive sheet.

In summarizing the arrangements described and/or claimed herein, a selection of concepts and/or elements and/or steps that are described in the detailed description herein may be made or simplified. Any summary is not intended to identify key features, elements and/or steps, or essential features, elements and/or steps, relating to the claimed subject matter, and so are not intended to be limiting and should not be construed to be limiting of or defining of the scope and breadth of the claimed subject matter.

BRIEF DESCRIPTION OF THE DRAWING

The detailed description of the preferred embodiment(s) will be more easily and better understood when read in conjunction with the FIGURES of the Drawing which include.

Figure 1:
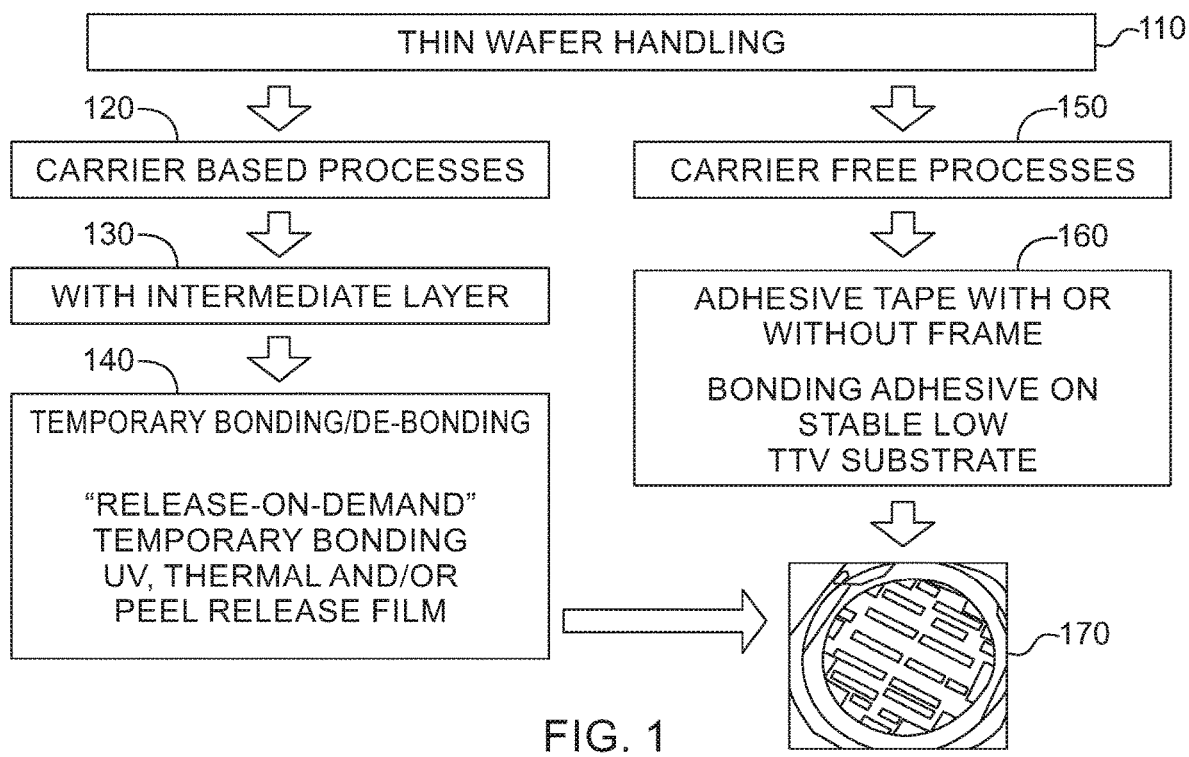
FIG. 1 is a schematic flow diagram of example embodiments of a thin wafer handling process using example temporary bonding solutions.

In the Drawing, where an element or feature is shown in more than one drawing figure, the same alphanumeric designation may be used to designate such element or feature in each figure, and where a closely related or modified element is shown in a figure, the same alphanumerical designation may be primed. Similar elements or features may be designated by like alphanumeric designations in different figures of the Drawing and with similar nomenclature in the specification. As is common, the various features of the drawing are not to scale, the dimensions of the various features may be arbitrarily expanded or reduced for clarity, and any value stated in any Figure is by way of example only.

DESCRIPTION OF THE PREFERRED EMBODIMENT(S)

FIG. 1 is a schematic flow diagram of example embodiments of a thin wafer handling process 100 using example temporary bonding solutions. Process 100 relates to the handling of thin wafers 110, e.g., semiconductor wafers that are initially thin and/or that are machined to reduce their thickness, e.g., may be ground to reduce thickness. Wafer handling 110 may employ a carrier based process 120 wherein the semiconductor wafer, e.g., a wafer 170, is mounted to a carrier, e.g., a stable substrate, that provides added strength and stability for the wafer 170 during processing, or may employ a carrier free process 150.

Carrier based processes 120 utilize an intermediate layer 130 between the semiconductor wafer 170 and the wafer carrier for mounting the wafer 170 to the carrier for and during the processing thereof. The intermediate layer 130 includes a temporary bonding and de-bonding material 140 that first provides for mounting the semiconductor to the carrier or substrate for processing, e.g., temporarily, and then provides for releasing the semiconductor wafer 170 from the carrier or substrate at the completion of wafer 170 processing. Preferably, de-bonding 140 of intermediate layer 130 includes a "release-on-demand" characteristic, e.g., the wafer 170 is released (de-bonded) when desired in the process, and release may be initiated by the application of ultra-violet (UV) and/or thermal energy, and/or by physically peeling the wafer 170 away from the carrier or substrate.

Intermediate layers 130 therefor may include, e.g., those having a low total thickness variation (TTV) film based heat lamination that conforms to ultra-low TTV void free bonding, or those having a UV releasing glass facing layer for ply release upon exposure to UV light. A thermal and/or peel releasable layer may be utilized facing the wafer 170, and may be released by peeling with or without thermal energy, e.g., heating, being applied. Such layers desirably leave no residue, e.g., substantially 0% of the layer remains, so that rinsing and/or cleaning of the carrier and/or of the semiconductor wafer 170, e.g., with purified water or a solvent, is not required following the release of the semiconductor wafer 170 and/or the carrier.

On the other hand, carrier free processes 150 preferably utilize adhesive tape 160 with or without a frame, e.g., a support frame. Adhesive tape 160 is typically a temporary bonding adhesive on a dimensionally stable TTV substrate.

Any of the foregoing processes may be employed for processing a semiconductor wafer 170 having a plurality of semiconductor circuits thereon, e.g., on the front side of the wafer, that are subsequently separated, e.g., scribed and diced, into individual semiconductor chips each having one or more electronic circuits or devices thereon.

Figure 2A:
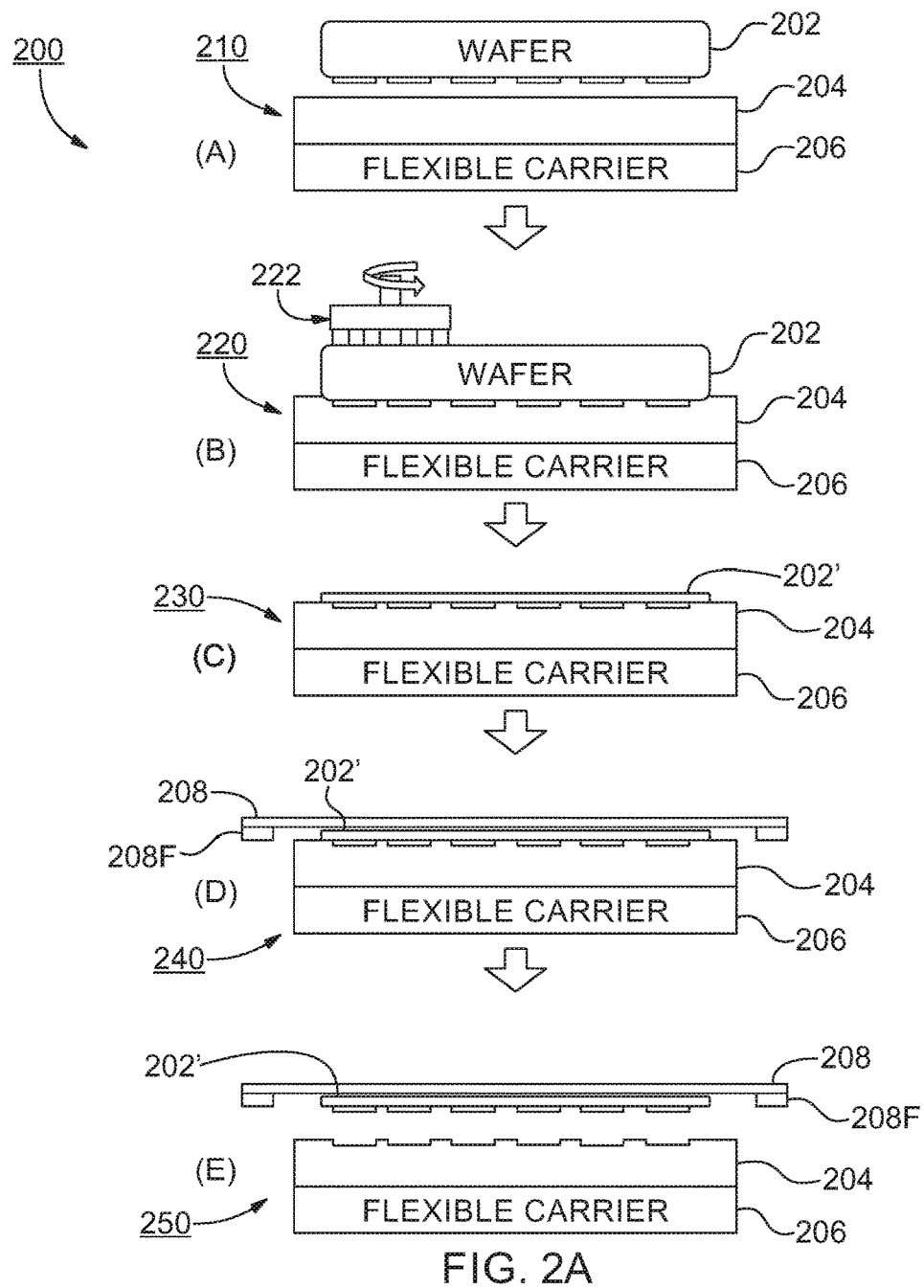
FIG. 2A is a schematic flow diagram of a workflow process employing an example configuration of a releasable sheet.
Figure 2B:
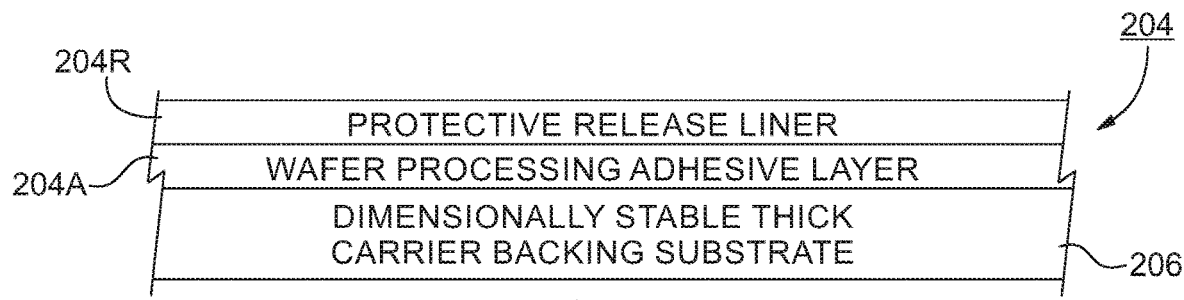
FIG. 2B is an example configuration of a releasable sheet for use with a thermally stable support carrier substrate that is useful with the workflow process of FIG. 2A.

FIG. 2A is a schematic flow diagram of a workflow process 200 employing an example configuration of a releasable sheet 204, and FIG. 2B is an example configuration of a releasable sheet 204 for use with a thermally stable support carrier substrate 206 that is useful with the workflow process 200 of FIG. 2A. In process 200, in step (A) 210 a wafer 202 is brought near to a releasable sheet 204 of wafer processing adhesive (WPA) of FIG. 2B which is on a dimensionally stable flexible carrier 206. Wafer 202 may or may not have been processed to have semiconductor circuits or other features formed thereon, and process 200 is not affected thereby. The front side of wafer 202 is bonded, e.g., heat laminated, to temporary bonding adhesive sheet 204 which provides a temporary bonding layer adhering wafer 202 to dimensionally stable carrier 206, e.g., a dimensionally stable thick carrier backing substrate, which may be of glass or metal or another suitably stable material.

In step (B), 220, the exposed (e.g., back) side of the wafer 202 remains exposed and the front side is attached to flexible carrier 204, 206 which is processed to remove 222 wafer material therefrom, e.g., by grinding 222 using a grinding tool 222, until the thickness of wafer 202 is reduced to a thinner wafer 202' having a predetermined thickness. As illustrated in step (C), 230, thinned wafer 202' is then processed to decrease any stress arising from the mechanical thinning 222, while still attached to flexible carrier 206 by releasable sheet 204.

Then in step (D), 240, a dicing tape 208, e.g., a sheet of dicing tape 208 or a conformal dicing tape 208, is applied to the exposed side, e.g., the flat thinned side, of wafer 202'. Dicing tape 208 may be supported on a frame 208F for ease of handling and/or support. Optionally, 2.5-3D processing may be performed on thinned wafer 202'.

Finally, releasable sheet 204 with flexible carrier 202 remaining attached thereto is removed in Step (E), 250, from thinned wafer 202' which remains attached to dicing tape 208 with the side thereof that may have electronic parts or other features thereon exposed, e.g., for further processing and dicing. Removal 250 includes applying heat and/or UV radiation to substantially decrease the adhesion between releasable layer 204 and wafer 202' sufficiently so that releasable layer 204 may be physically peeled away from thinned wafer 202' with zero percent (0%) or substantially zero percent (0%) residual material remaining on thinned wafer 202'. Where the wafer processing adhesive of layer 204 has sufficiently low resistance to being peeled away from wafer 202' while leaving substantially 0% residual material on wafer 202', it may be peeled away from wafer 202' without exposure to thermal or UV energy. Where an opaque carrier 206 is employed, releasing 260 is by thermal heating and peeling or by peeling alone.

One disadvantage to prior art arrangements is that the glass carriers are expensive and must be meticulously cleaned for re-use. The present process 200 may employ a disposable mechanical carrier 206 rather than a glass carrier, although the adhesive structure thereof can function with a glass carrier as well. Carrier 206 must be substantially flat and remain substantially flat with close to zero thickness variation during the back grinding step 220 and subsequent wafer processing steps. Typical thickness variations of less than, e.g., less than about 5 microns for most wafer operations and less than about 1-2 microns for extreme wafer applications, are preferred. In addition, flexible carrier 206 must remain dimensionally stable, e.g., without substantial deformation, shrinkage or melting, under high temperature processing conditions in the range of about 150-250° C. and in some processes to about 300° C. or 350° C.

In addition, the present process 200 differs from conventional processing in that wafer processing adhesive 204A may be applied, e.g., pre-applied, to the dimensionally stable thick carrier 206 prior to its use with a wafer 202, and a protective release liner 204R is applied on adhesive layer 204A, as illustrated, to protect the adhesive from, e.g., mechanical damage and/or debris, until the release liner 204R is removed shortly before wafer 202 is brought into contact with the wafer processing adhesive 204A which is attached to flexible carrier 206. Alternatively, adhesive layer 204A may be formed on a release liner 204R and a second release liner, already removed in FIG. 2B, may be placed on the other side of adhesive layer 204A, if desired, between the time of its fabrication and the time of its being applied to a substrate 206.

Suitable wafer processing adhesives 204A preferably have a preferential adhesion to the wafer material, e.g., to silicon, than to the flexible carrier 206 material, e.g., to a glass, an optical glass, a ceramic, a metal, a blank semiconductor wafer, an unoriented polyester, a high temperature polyester film such as polyimide, polysulfone, poly ether ether ketone (PEEK), and any polymer with dimensional stability at a temperature from 150°-350° C., and the like, whereby adhesive layer 204 will remain adhered to the rigid or flexible carrier 206 while releasing from thinned wafer 202', whether released after exposure to thermal or UV energy and/or mechanically peeled away.

Suitable flexible carrier materials should be dimensionally stable in all directions under the highest expected temperature exposure, e.g., 200° C., 270° C. or 330° C., with less than about 5 microns, and preferably less than about 2 microns, distortion in the wafer facing direction. That stability should be maintained under solvent and other processing, and when resting on a conventional glass carrier or being held in place by a metal chuck with vacuum. In addition, the carrier substrate, whether of a metal or of high temperature plastic, should be sufficiently flexible as to provide release support during a peeling release process.

Suitable wafer processing adhesives should have the following properties: pressure-sensitive at ambient conditions or capable of being heat laminated at temperatures from 30° to 150° C., sufficiently flexible as to not exert interfacial stresses that would to cause warping of the semiconductor wafer, e.g., the thinned wafer, during processing, stability against degradation at high temperatures from 150°-350° C. at least under a non-oxidizing environment such as a vacuum, nitrogen blanking, and the like, an ability to cure with exposure to cure under UV and/or heat energy so that bond strength can be reduced substantially, e.g., by 80% or more, having preferential bonding onto flexible carriers such as metal foils, high temperature stabilized polymers such as un-orientated PET, polyimide, PEEK, and other suitable polymeric films, and an ability to be laminated with adhesive layers having a different curing mechanism.

Examples thereof include, but are not limited to, wafer processing adhesive types WPA-PR-200. WPA-PR-270, and WPA-PR-330; thermal release adhesive types WPA-TR-200 and WPA-TR-270; and UV release adhesives types WPA-UVR-200 and WPA-UVR-270, each of which are available from AI Technology, Inc. of Princeton Junction, N.J., USA. Selection of the adhesive 204, e.g., whether simply peeled away, peeled with by thermal releasing with exposure to high temperature or UV releasing with exposure to high temperature, will depend largely upon its release characteristics given the temperature of processing and the residual holding adhesion and stability required during wafer processing. In general, peel releasing adhesive 204 is preferred where processing at or above about 200° C. is required.

After wafer processing is completed, the flexible carrier or glass carrier 206 can be peeled away from the wafer, e.g., by inserting a sharp object into the wafer processing adhesive 204, and then peeling the adhesive layer 204 away from the wafer 202', thereby to expose the front side of wafer 202' on which semiconductor circuits and other features may have been formed.

Figure 3A:
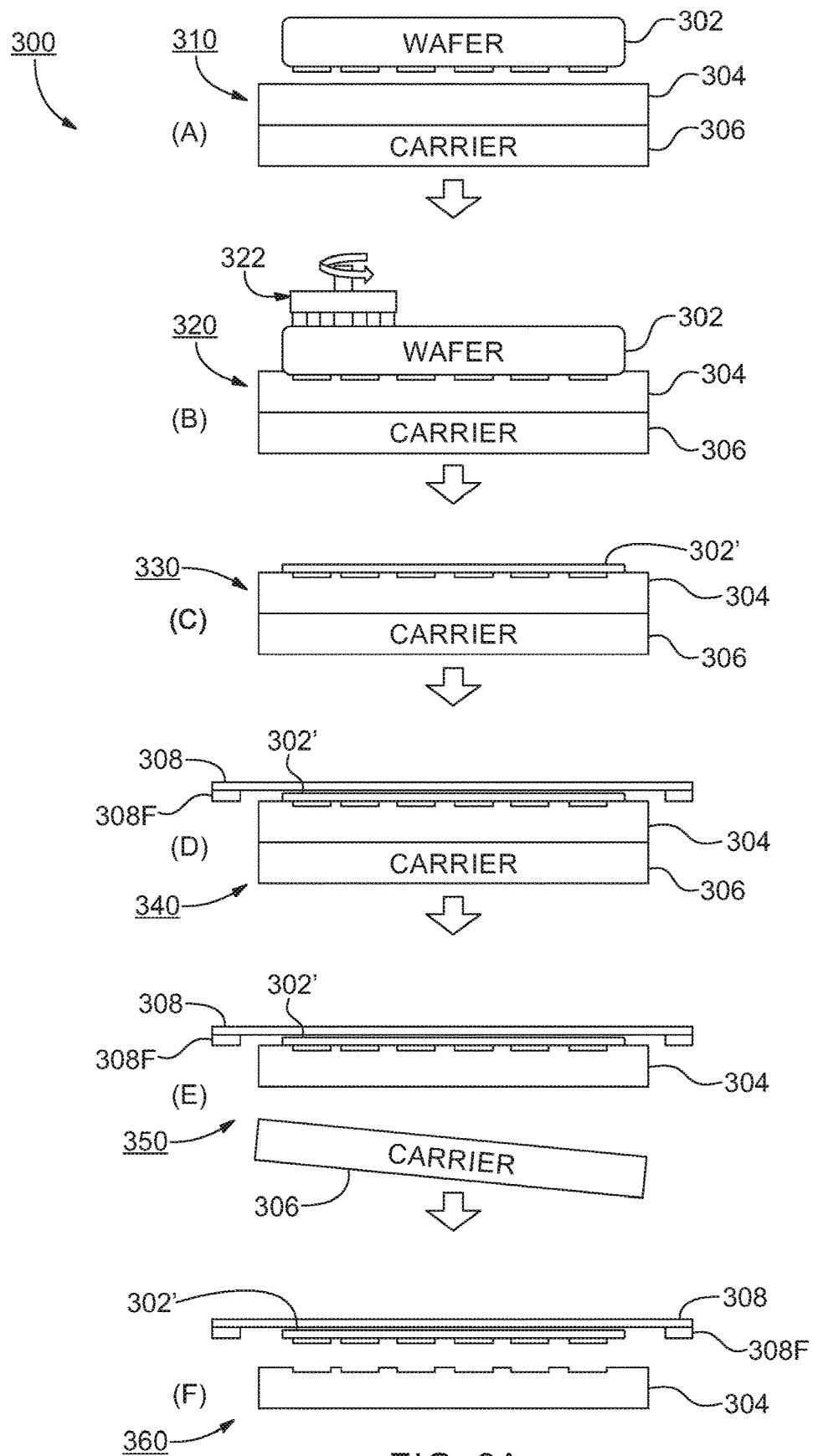
FIG. 3A is a schematic flow diagram of a workflow process employing an example configuration of a releasable sheet.
Figure 3B:
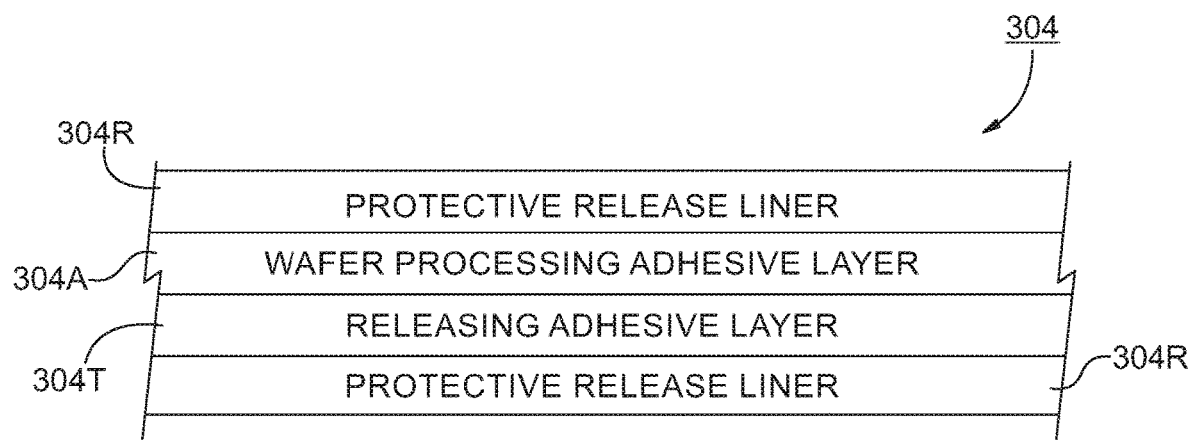
FIG. 3B is an example configuration of a releasable sheet without a support carrier substrate that is useful with the workflow process of FIG. 3A.

FIG. 3A is a schematic flow diagram of a workflow process 300 employing an example configuration of a releasable sheet 304, and FIG. 3B is an example configuration of a releasable sheet 304 without a support carrier substrate that is useful with the workflow process 300 of FIG. 3A. Wafer 302 may or may not have been processed to have semiconductor circuits or other features formed thereon, and process 300 is not affected thereby. The front side of wafer 302 is bonded, e.g., heat laminated, to the temporary bonding plural layer adhesive sheet 304 which provides a temporary bonding layer adhering wafer 302 to dimensionally stable carrier 306, whether of metal or glass or another suitably stable carrier material.

In step (B), 320, the exposed (e.g., back) side of wafer 302, of which the front side remains attached to flexible carrier 306, is processed to remove 322 wafer material therefrom, e.g., by grinding 322 using a grinding tool 322, until the thickness of wafer 302 is reduced to a thinner wafer 302' having a predetermined thickness. As illustrated in step (C), 330, thinned wafer 302' is then processed to decrease any stress arising from the mechanical thinning 322, while still attached to flexible carrier 306 by releasable sheet 304.

Then in step (D), 340, a dicing tape 308, e.g., a sheet of dicing tape 308 or a conformal dicing tape 308, is applied to the exposed (back) side of wafer 302'. Dicing tape 308 may be supported on a frame 308F for ease of handling and/or support. Optionally, 2.5-3D processing may be performed on thinned wafer 302'.

In step (E), 350, the carrier 306 is removed from adhesive layer 304 which remains adhered to thinned wafer 302'. Removal 350 includes applying heat and/or UV radiation to or through carrier 306 to substantially decrease the adhesion between releasable layer 304 and carrier 306 sufficiently so that carrier may be physically removed from releasable layer 304. Carrier 306 may be a glass carrier 306 or a disposable carrier 306 as described, and should be transparent to UV radiation if an UV releasing adhesive is employed.

Finally, releasable sheet 304 is removed in Step (F), 360, from the front side of thinned wafer 302' which remains attached to dicing tape 308 with the side of wafer 302' that may have electronic parts or other features thereon exposed, e.g., for further processing and dicing. Removal 350 includes applying heat and/or UV radiation to substantially decrease the adhesion between releasable layer 304 and wafer 302' sufficiently so that releasable layer 304 may be physically peeled away from thinned wafer 302' with zero percent (0%) or substantially zero percent (0%) residual material remaining on thinned wafer 302'. Where the wafer processing adhesive of layer 304 has sufficiently low resistance to being peeled away from wafer 302' while leaving substantially 0% residual material on wafer 302', it may be peeled away from wafer 302' without exposure to thermal or UV energy.

Carrier 306 must be substantially flat and remain substantially flat with close to zero thickness variation during the back grinding step 320 and subsequent wafer processing steps. Typical thickness variations of less than, e.g., less than about 5 microns for most wafer operations and less than about 1-2 microns for extreme wafer applications, are preferred. In addition, carrier 306 must remain dimensionally stable, e.g., without substantial deformation, shrinkage or melting, under high temperature processing conditions in the range of about 150-250° C. and in some processes to about 300° C. or 350° C.

In addition, the present process 300 differs from conventional processing and from process 200 in that a plural layer wafer processing adhesive 304 is employed. A first protective release liner 304R serves as a base layer that is removed before the completed wafer processing adhesive sheet 304 is to be applied to a carrier 306. Plural layer wafer processing adhesive sheet 304 includes a high-temperature UV and/or thermally releasing adhesive layer 304T that is on the first protective release liner 304R and a wafer processing adhesive layer 304A that is on the UV and/or thermally releasing layer 304T, and a second protective release liner 304R is applied on the adhesive layer 304A to protect the adhesive 303A from, e.g., mechanical damage and/or debris, until the second release liner 304R is removed shortly before wafer 302 is brought into contact with adhesive layer 304A of the plural layer wafer processing adhesive sheet 304.

Plural layer wafer processing adhesive sheet 304 may be formed beginning with either the top or bottom release layer 304R serving as a base to which the other layers 304A, 304R are applied, and any or all of the layers 304A, 304T, 304R may be formed in place or applied as a sheet of adhesive and/or high-temperature adhesive and/or release liner, as may be convenient. Plural layer wafer processing adhesive sheet 304 may be first applied to carrier 306 and then wafer 302 may be applied to adhesive sheet 304, or adhesive sheet 304 may be first applied to wafer 302 and then carrier 306 may be applied to sheet 304. Preferably, adhesive sheet 304 is applied to wafer 302 for easier removal of entrapped air between wafer 302 and sheet 304, e.g., under laminating pressure and/or a vacuum condition.

Suitable wafer processing releasing adhesives 304T preferably have a preferential adhesion to the wafer processing adhesive material 304A than to the flexible carrier 306 material, e.g., to glass, ceramic, metal, blank semiconductor wafer, an unoriented polyester, a high temperature polyester film such as polyimide, polysulfone, poly ether ether ketone (PEEK), and any polymer with dimensional stability at a temperature from 150°-350° C., and the like, whereby adhesive layers 304T, 304A will remain adhered to wafer 302' when carrier 306 is removed. Wafer processing adhesive layer 304A preferentially adheres to release adhesive layer 340T than to thinned wafer 302', thereby allowing the adhesive layers 304A, 304T to be removed from thinned wafer 302', whether released after exposure to thermal or UV energy or being mechanically peeled away.

Suitable flexible carrier materials should be dimensionally stable in all directions under the highest expected temperature exposure, e.g., 200° C., 270° C. or 330° C., with less than about 5 microns, and preferably less than about 2 microns, distortion in the wafer facing direction. That stability should be maintained under solvent and other processing, and when resting on a conventional glass carrier or being held in place by a metal chuck with vacuum. In addition, the carrier substrate, whether of a metal or of high temperature plastic, should be sufficiently flexible as to provide release support during a peeling release process.

Suitable wafer processing adhesive sheets 304 including adhesive layers 304A and 304T should have the following properties: pressure-sensitive at ambient conditions or capable of being heat laminated at temperatures from 30° to 150° C., sufficiently flexible as to not exert interfacial stresses that would to cause warping of the semiconductor wafer, e.g., the thinned wafer, during processing, stability against degradation at high temperatures from 150°-350° C. at least under a non-oxidizing environment such as a vacuum, nitrogen blanking, and the like, an ability to cure with exposure to cure under UV and/or heat energy so that bond strength can be reduced substantially, e.g., by 80% or more, having preferential bonding onto flexible carriers such as metal foils, high temperature stabilized polymers such as un-orientated PET, polyimide, PEEK, and other suitable polymeric films, and an ability to be laminated with adhesive layers having a different curing mechanism.

Examples thereof include, but are not limited to, wafer processing adhesive sheets 304 suitable up to about 270° C. include peel and/or thermal release adhesive types WPA-PR-TR-200-CF and WPA-PR-TR-270-CF; and peel and/or UV release adhesives types WPA-PR-UVR-200-CF and WPA-PR-UVR-270-CF, each of which are available from AI Technology, Inc. of Princeton Junction, N.J., USA. and wafer processing adhesive sheets 304 suitable above about 270° C. include thermal release adhesive sheet type WPA-330 (which is laminated between wafer 302 and a glass carrier 306), each of which are available from AI Technology, Inc. of Princeton Junction, N.J., USA. Selection of the adhesive sheet 304, e.g., whether simply peeled away, peeled with by thermal releasing with exposure to high temperature or UV releasing with exposure to UV energy and optionally high temperature, will depend largely upon its release characteristics given the temperature of processing and the residual holding adhesion and stability required during wafer processing. In general, peel releasing adhesive 304 is preferred where processing at or above about 200° C. is required.

After wafer processing is completed, the flexible carrier or glass or other carrier 306 can be peeled away from the thinned wafer, e.g., by inserting a sharp object into the wafer processing adhesive 304, and then peeling the adhesive layer 304 away from the wafer 302', thereby to expose the front side of wafer 202' on which semiconductor circuits and other features may have been formed.

One variation of process 300 includes, e.g., first heat-pressure-laminating a wafer processing adhesive sheet 304 onto wafer 302, followed by heat-pressure-laminating the wafer and sheet onto the carrier 306, e.g., a glass carrier, while another variation includes placing the adhesive sheet between wafer 304 and carrier 306 and then heat-pressure-laminating the stacked layers and parts in a single lamination.

Figure 4A:
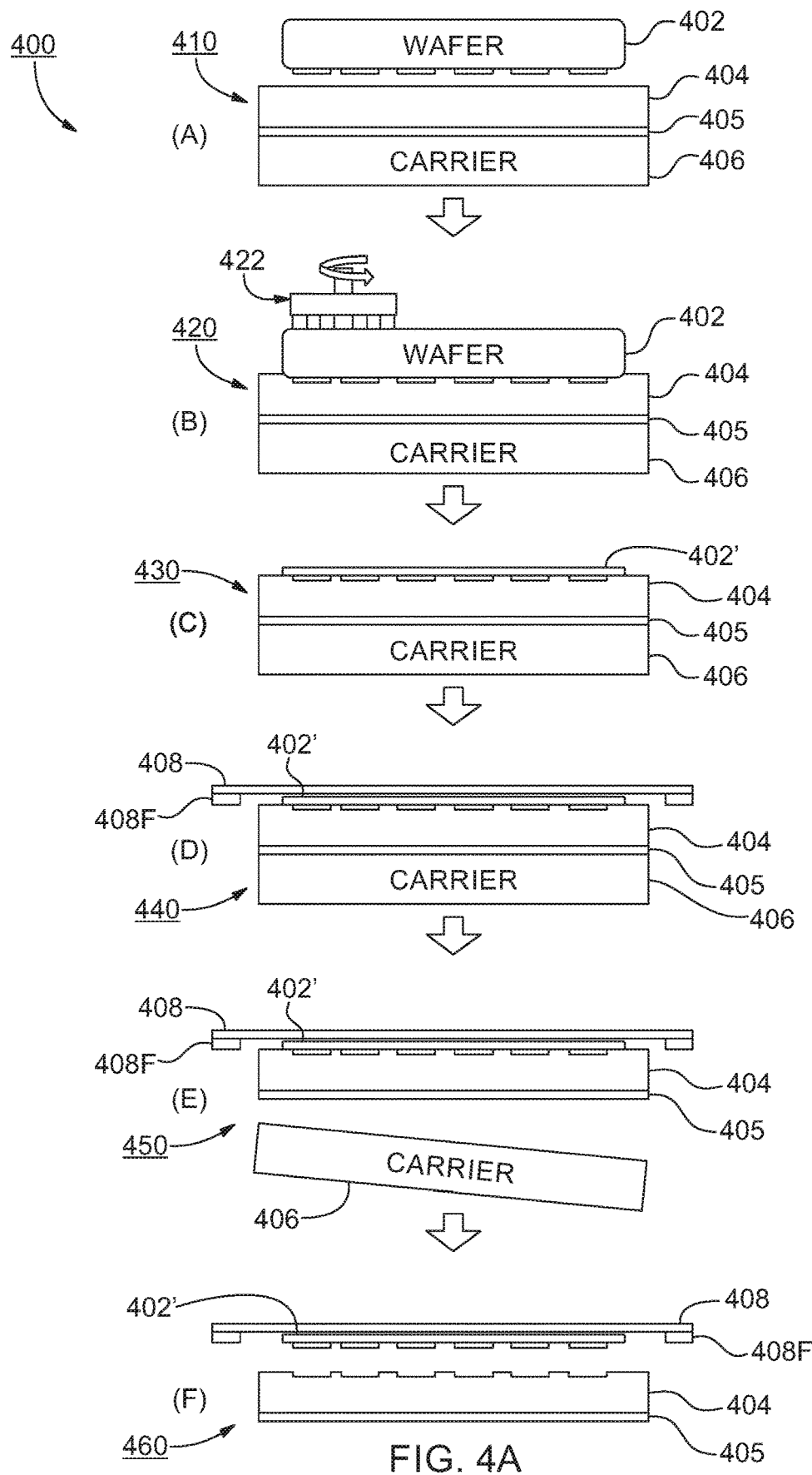
FIG. 4A is a schematic flow diagram of a workflow process employing an example configuration of a releasable sheet.
Figure 4B:
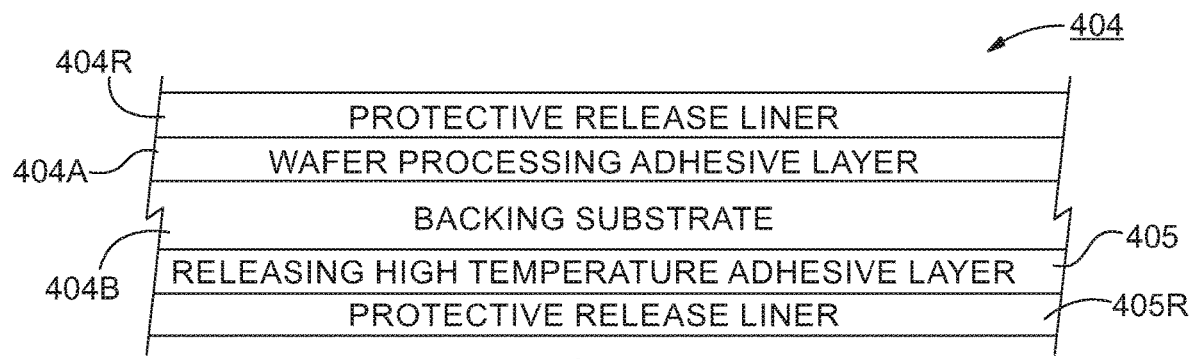
FIG. 4B is an example configuration of a releasable sheet for use with a support carrier substrate useful with the workflow process of FIG. 4A.
Figure 4C:
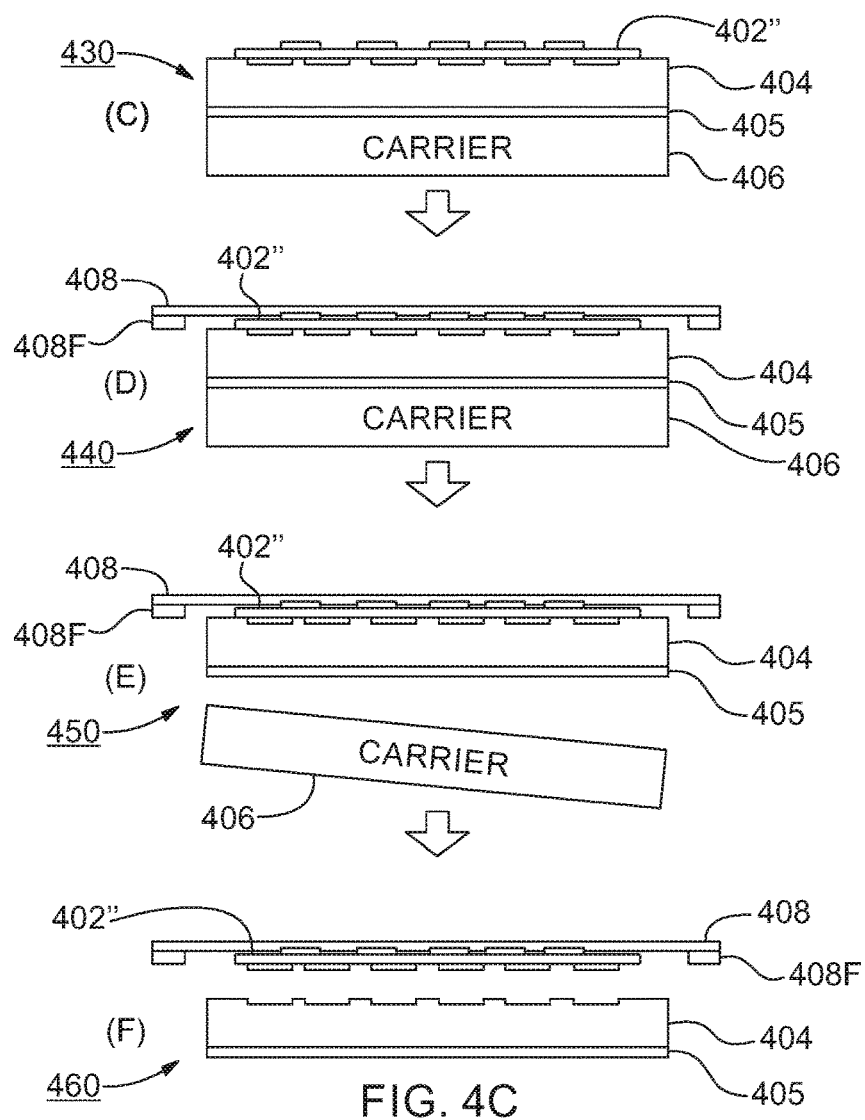
FIG. 4C is a schematic diagram of a modified work flow process of a portion of FIG. 4A.

FIG. 4A is a schematic flow diagram of a workflow process 400 employing an example configuration of a releasable sheet 404, FIG. 4B is an example configuration of a releasable sheet 404 for use with a support carrier substrate 406 useful with the workflow process 400 of FIG. 4A, and FIG. 4C is a schematic diagram of a modified work flow process of a portion of FIG. 4A. Wafer 402 may or may not have been processed to have semiconductor circuits or other features formed thereon, and process 400 is not affected thereby. The front side of wafer 402 is bonded, e.g., heat laminated, to the temporary bonding plural layer adhesive sheet 404 which provides a temporary bonding layer that adheres wafer 402 to dimensionally stable carrier 406, which may be, e.g., glass or metal or another suitable material.

In step (B), 420, the exposed (e.g., back) side of wafer 402 which remains attached to flexible carrier 406 is processed to remove 422 wafer material therefrom, e.g., by grinding 422 using a grinding tool 422, until the thickness of wafer 402 is reduced to a thinner wafer 402' having a predetermined thickness. As illustrated in step (C), 430, thinned wafer 402' is then processed to decrease any stress arising from the mechanical thinning 422, while still attached to flexible carrier 406 by releasable sheet 404.

Then in step (D), 440, a dicing tape 408, e.g., a sheet of dicing tape 408 or a conformal dicing tape 408, is applied to the exposed side of wafer 402'. Dicing tape 408 may be supported on a frame 408F for ease of handling and/or support. Optionally, 2.5-3D processing may be performed on thinned wafer 402'.

In step (E), 450, the carrier 406 is removed from adhesive layer 404 which remains adhered to thinned wafer 402'. Removal 450 includes applying heat and/or UV radiation to or through carrier 406 to substantially decrease the adhesion between releasable layer 404 and carrier 406 sufficiently so that carrier may be physically removed from releasable layer 404. Carrier 406 may be a glass carrier 406 or a disposable carrier 406 as described, and should be transparent to UV radiation if an UV releasing adhesive is employed.

Finally, releasable sheet 404 is removed in Step (F), 460, from thinned wafer 402' which remains attached to dicing tape 408 with the side thereof that may have electronic parts or other features thereon exposed, e.g., for further processing and dicing. Removal 450 includes applying heat and/or UV radiation to substantially decrease the adhesion between releasable layer 404 and wafer 402' sufficiently so that releasable layer 404 may be physically peeled away from thinned wafer 402' with zero percent (0%) or substantially zero percent (0%) residual material remaining on thinned wafer 402'. Where the wafer processing adhesive of layer 404 has sufficiently low resistance to being peeled away from wafer 402' while leaving substantially 0% residual material on wafer 402', it may be peeled away from wafer 402' without exposure to thermal or UV energy.

Carrier 406 must be substantially flat and remain substantially flat with close to zero thickness variation during the back grinding step 420 and subsequent wafer processing steps. Typical thickness variations of less than, e.g., less than about 5 microns for most wafer operations and less than about 1-2 microns for extreme wafer applications, are preferred. In addition, carrier 406 must remain dimensionally stable, e.g., without substantial deformation, shrinkage or melting, under high temperature processing conditions in the range of about 150-250° C. and in some processes to about 300° C. or 350° C.

In addition, the present process 400 differs from conventional processing and from process 200 in that a plural layer wafer processing adhesive 404, 405 is employed. A first protective release liner 404R serves as a base layer that is removed before the completed wafer processing adhesive sheet 404, 405 is to be applied to a wafer 202. Plural layer wafer processing adhesive sheet 404 includes a wafer processing adhesive layer 404A that is between the first protective release liner 404R and a dimensionally stable baking substrate 404B that is suitable for use up to about 200° C. to 330° C.

Plural layer wafer processing adhesive sheet 405 includes a UV and/or thermally releasing high-temperature adhesive layer 404T that is on a first protective release liner 405R to protect the adhesive 405 from, e.g., mechanical damage and/or debris, until the second release liner 405R is removed shortly before plural layer sheet 404, 405 is brought into contact with a carrier 406.

Both wafer processing adhesive 404A and high temperature adhesive layer 405 must have preferentially stronger adhesion to the backing substrate 404B material, e.g., a glass, optical glass, ceramic, metal, semiconductor wafer or other suitable material. Similarly, wafer processing adhesive 404A must have preferentially stronger adhesion to the backing substrate 404B material than to the semiconductor wafer 402.

Plural layer wafer processing adhesive sheet 404, 405 may be formed beginning with either the top or bottom release layer 404R or 405R serving as a base to which the other layers 404A, 404B, 405 are applied, and any or all of the layers 404A, 404B, 405 may be formed in place or applied as a sheet of adhesive and/or high-temperature adhesive and/or release liner, as may be convenient. Plural layer wafer processing adhesive sheet 404, 405 may be first applied to carrier 406 and then wafer 402 may be applied to plural layer adhesive sheet 404, 405, or adhesive sheet 404, 405 may be first applied to wafer 402 and then carrier 406 may be applied to plural layer sheet 404, 405. Preferably, adhesive sheet 404 is applied to wafer 402 for easier removal of entrapped air between wafer 402 and sheet 404, e.g., under laminating pressure and/or a vacuum condition.

Suitable wafer processing releasing adhesives 404A preferably have a preferential adhesion to the flexible carrier backing substrate 406 material, e.g., to glass, a ceramic, a metal, a blank semiconductor wafer, an unoriented polyester, a high temperature polyester film such as polyimide, polysulfone, poly ether ether ketone (PEEK), and any polymer with dimensional stability at a temperature from 150°-350° C., and the like, whereby adhesive layer 404A will remain adhered to backing substrate 404B when wafer 402' is removed.

Suitable dimensionally stable backing substrate 404B materials should be dimensionally stable in all directions under the highest expected temperature exposure, e.g., 200° C., 270° C. or 330° C., with less than about 5 microns, and preferably less than about 2 microns, distortion in the wafer facing direction. That stability should be maintained under solvent and other processing, and when resting on a conventional glass carrier or being held in place by a metal chuck with vacuum. In addition, the backing substrate 404B, whether of a metal or of high temperature plastic, should be sufficiently flexible as to provide release support during a peeling release process.

Suitable wafer processing adhesive sheets 404 including adhesive layer 404A should have the following properties: pressure-sensitive at ambient conditions or capable of being heat laminated at temperatures from 30° to 150° C., sufficiently flexible as to not exert interfacial stresses that would to cause warping of the semiconductor wafer, e.g., the thinned wafer, during processing, stability against degradation at high temperatures from 150°-350° C. at least under a non-oxidizing environment such as a vacuum, nitrogen blanking, and the like, an ability to cure with exposure to cure under UV and/or heat energy so that bond strength can be reduced substantially, e.g., by 80% or more, having preferential bonding onto flexible carriers such as metal foils, high temperature stabilized polymers such as unorientated PET, polyimide, PEEK, and other suitable polymeric films, and an ability to be laminated with adhesive layers having a different curing mechanism.

Examples thereof include, but are not limited to, wafer processing adhesive sheets 404 suitable up to about 270° C. include thermal release adhesive types WPA-PR-TR-200 and WPA-PR-TR-270; and UV release adhesives types WPA-PR-UVR-200 and WPA-PR-UVR-270, each of which are available from AI Technology, Inc. of Princeton Junction, N.J., USA. Wafer processing adhesive sheets 404 suitable above about 270° C. may include thermal release adhesive sheet type WPA-330 (which is laminated between wafer 402 and a glass carrier 406), each of which is also available from AI Technology, Inc.

Selection of the adhesive sheet 404, e.g., whether simply peeled away, peeled with by thermal releasing with exposure to high temperature or UV releasing with exposure to UV energy and optionally high temperature, will depend largely upon its release characteristics given the temperature of processing and the residual holding adhesion and stability required during wafer processing. In general, peel releasing adhesive 404 is preferred where processing at or above about 200° C. is required.

After wafer processing is completed, the flexible carrier 406 can be peeled away from the thinned wafer 402', e.g., by inserting a sharp object into the wafer processing adhesive 404A, and then peeling the adhesive layer 404 away from the wafer 402', thereby to expose the front side of wafer 202' on which semiconductor circuits and other features may have been formed.

One variation of process 400 includes, e.g., first heat-pressure-laminating a wafer processing adhesive sheet 404, 405 onto wafer 402, followed by heat-pressure-laminating the wafer and sheet onto the carrier 406, e.g., a glass or other carrier, while another variation includes placing the adhesive sheet between wafer 404 and carrier 406 and then heat-pressure-laminating the layers.

In the modified work flow process 400 as illustrated in FIG. 4C for a portion thereof including steps (C) through (F) from FIG. 4A, the processing of wafer 202' after the thinning step (B), 420 included processing to form electronic circuits and/or other features on the thinned side of wafer 402' to produce processed wafer 402" in step (C). Thereafter, steps (D), 440, (E), 450 and (F), 460 show the processing of wafer 402" in the same manner as that of wafer 402' as described herein.

Further, any of the foregoing processes 200, 300, 400 can and often do include the processing of thinned wafer 202', 302', 402' after the thinning step (B), 220, 320, 420, included the processing thereof to form electronic circuits and/or other features on the thinned, e.g., back, side of wafer 202', 302', 402' to produce a processed wafer similarly to that described in relation to processed wafer 402" in step (C), 430 of process 400. Thereafter, the remaining steps of processes, 200, 300, 400. e.g., step (D), 240, 340, 440, step (E), 250, 350, 450 and step (F), 360, 460, would show the processing of a respective processed thinned wafer in the same manner as that of wafers 202', 302', 402' as described herein.

In a typical embodiment, e.g., in accordance with any or all of the foregoing example embodiments, the wafer processing adhesives, e.g., adhesives 204A, 304A, 304T, 404A, 405, have at least about 100 gm/25 mm peel strength and/or at least about 10 psi die shear in a temperature range of about 25-50° C. Further, thermal and/or UV releasing adhesives lose at least about 80% of their peel strength, and preferably about 95% of their peel strength, following exposure to their specified levels of thermal and/or UV energy.

Wafer supporting adhesives that adhere to the semiconductor wafer should leave substantially 0% residual material remaining on the surface of the semiconductor wafer after the adhesive is removed from the wafer by peeling, and/or applying their specified level of thermal release and/or UV release energy, wherein the amount of residual adhesive is sufficiently low that proper and reliable soldering and adhesive bonding can be made to the wafer without requiring rinsing and/or cleaning of the wafer after processing. Herein, substantially 0% encompasses, e.g., a weight percentage (%) of less than about 5% and preferably less than about 0.5%. and/or a surface coverage of residual adhesive of less than about 5% and preferably less than about 1%. In the event that substantial residual material remains, it should be easily removable, e.g., by mechanical means, a solvent and/or oxidation etching using high temperature or plasma.

The adhesives employed in wafer processing sheets 204, 304 and 404, 405 should not outgas, e.g., the adhesives do not release more than about 1% by weight and preferably less than about 0.5% by weight at the maximum temperature to which it is exposed during wafer processing and/or when exposed to a high vacuum, e.g., less than $10^{-3}$ Torr, and it may be exposed to pressures as low as $10^{-6}$ Torr or lower.

Preferably, it is desirable that such wafer processing adhesives should be a pressure sensitive adhesive at room temperature, e.g., about 20-30° C., or is dry to the touch at room temperature and melt bondable at a temperature in the range of, e.g., about 100-200° C. It is also preferred that such adhesive layer itself and/or as applied on a carrier or substrate have a variation in total thickness of about 5 microns or less, and preferably about 2 microns or less.

The wafer processing adhesive is adhered to the front side of the semiconductor wafer on which electronic circuits and/or other features may already have been formed, and, so that wafer surface will not be smooth, but will vary relatively substantially due to the height and differences in height of the various features formed on the wafer. For the wafer processing adhesive to accommodate the different thickness of the semiconductor wafer, the adhesive must be conformable to features that are formed on and that extend out of the semiconductor wafers, e.g., features having a height from about 5 microns to about 250 microns or more. To this end, in this instance, as long as the thickness of the adhesive layer is more than about 1.5 times, and preferably more than about 2.0 times, the height of the features on the wafer.

The wafer processing adhesive, high temperature releasing adhesive and carrier facing adhesive, may be made into sheets and/or applied to a substrate, e.g., a wafer and/or carrier, by applying a preformed sheet of the adhesive to be laminated onto the specific surfaces independently and separately on the wafer side and carrier or substrate side, followed by vacuum pressure lamination. In addition, the wafer facing and carrier facing adhesives can be made into a plural layer laminate sheet for vacuum-pressure-heat lamination onto either the wafer or carrier, and then be vacuum-pressure-heat laminated onto the other of the carrier or wafer. Further, each of the wafer facing adhesive and the carrier facing adhesive can be dispersed in a solvent to facilitate spin coating onto a suitable desired thickness on the wafer or carrier separately, e.g., spin coating and drying of one adhesive followed by spin coating of the second adhesive, and, then after the solvent is removed, e.g., by heating and/or vacuum, vacuum-pressure-heat laminating the two adhesive layers together.

Further in relation thereto, suitable materials for backing substrate 404B as well as other carriers, include, e.g., high temperature thermoplastic and/or thermosetting films that do not have orientation stresses or can be annealed to not have such stresses, and can be processed to have less than about 2 micron total thickness tolerance. Flexible low cost metals such as, e.g., aluminum, steel, stainless steel, copper and composites including such materials, and high-temperature plastics, with the same low thickness tolerance and variation, and that will not be deformed over the temperature range of about 200-400° C. can also be employed. Such materials may also be employed in flexible carriers.

Among suitable and/or preferred high temperature plastics for backing substrates and/or carriers are, e.g., polyimide, and high temperature liquid crystal polymers including, e.g., poly ether ether ketone (PEEK), polysulfone, an unoriented polyester, and liquid crystal polymers and polyimides, that have been plasma and/or corona treated. For lower temperature processes, e.g., those at less than 200° C., such backing substrates may be cast from polyesters or polyacrylonitrile (PAN), polyphenylene sulfide (PPS), polyamide-imide, liquid crystal polymers and polyimides, and other similar plastics that have no orientation stress and have been surface treated to have high surface energy may be employed.

The surfaces of carrier materials and backing substrate materials should be surface treated, e.g., by plasma activation, corona treatment, wet chemical treatment, acid etching, grafting, thin-film coating, and the like, to enhance wetting and to increase the surface energy such carriers and substrates. Substrate and carrier surfaces must be treated to have a high surface energy, e.g., a surface energy of more than about 50 mJ/m$^2$.

Conventional wafer processing is understood to include spin coating the wafer processing adhesive on the back surface of the wafer and/or of the glass supporting substrate or carrier, to be thinned by spinning to obtain the desired thickness of the adhesive layer. In the arrangement herein, the wafer processing adhesive layers, the high temperature adhesive layer and the other layers are preferably sheets of material having the desired thickness that are applied to the substrate and/or carrier before being attached to the semiconductor wafer to be processed.

For reference, a micron or micro-meter (μm) is one millionth of a meter, or $\frac{1}{1000}$ of a millimeter, or 0.00003937 inch (about 0.00004 inch; about $\frac{1}{25000}$ inch) in English units.

A semiconductor wafer support arrangement for processing a semiconductor wafer including an adhesive sheet may comprise: a layer of wafer supporting adhesive supported by a substrate, the wafer supporting adhesive thereof having at least 100 gm/25 mm peel strength and/or at least 10 psi die shear at a temperature of about 20-50° C.; wherein the wafer supporting adhesive withstands exposure to a temperature of about 200° C. or higher for at least 3 minutes without decomposition; and has a stronger adhesion to the substrate than to a semiconductor wafer; wherein the wafer supporting adhesive outgasses less than about 0.5% by weight under a high vacuum; wherein the layer of adhesive leaves substantially 0% residual adhesive on the semiconductor wafer after removal therefrom; and where the wafer support arrangement is for use with a semiconductor wafer having features of up to a given height on a front surface thereof to be in contact with the wafer supporting adhesive, the layer of wafer supporting adhesive has a thickness that is more than about 1.5 times the given height of the features of the semiconductor wafer; the semiconductor wafer support arrangement wherein the substrate is formed of a material that is dimensionally stable at a temperature of about 200° C. or higher with a total thickness variation of less than about 5 microns and (a) the substrate is flexible and has flatness sufficient to stay on a holding chuck having a surface flatness tolerance of less than about 5 microns; and/or (b) the wafer supporting adhesive has stronger adhesion to the substrate than to the semiconductor wafer. The semiconductor wafer support arrangement may further comprise: a layer of high temperature adhesive supported on the wafer supporting adhesive layer, the high temperature adhesive having at least 100 gm/25 mm peel strength and/or at least 10 psi die shear at a temperature of about 20-50° C. The semiconductor wafer support arrangement wherein the high temperature adhesive loses at least about 80% of its peel strength on its side facing the semiconductor wafer when exposed to a predetermined amount of thermal energy and/or UV energy. The semiconductor wafer support arrangement wherein the substrate includes the dimensionally stable flexible carrier, the dimensionally stable flexible carrier having the wafer supporting adhesive layer on a first side thereof, and further comprising: a layer of high temperature adhesive supported on a second side of the dimensionally stable flexible carrier, the high temperature adhesive having at least 100 gm/25 mm peel strength and/or at least 10 psi die shear at a temperature of about 20-50° C. The semiconductor wafer support arrangement wherein the high temperature adhesive loses at least about 80% of its peel strength on its side facing the semiconductor wafer when exposed to a predetermined amount of thermal energy and/or UV energy. The semiconductor wafer support arrangement wherein the substrate is formed of a material that is dimensionally stable up to a temperature of about 200° C. or higher with a total thickness variation of less than about 2 microns. The semiconductor wafer support arrangement wherein the adhesive withstands exposure to a temperature of about 350° C. for at least 3 minutes without decomposition and has a stronger adhesion to the substrate than to a semiconductor wafer. The semiconductor wafer support arrangement wherein the layer of adhesive loses at least about 80% of its peel strength to the semiconductor wafer when exposed to a predetermined amount of thermal energy and/or UV energy. The semiconductor wafer support arrangement wherein the layer of adhesive loses at least about 95% of its peel strength to the semiconductor wafer when exposed to a predetermined amount of thermal energy and/or UV energy. The semiconductor wafer support arrangement wherein the substrate includes: a dimensionally stable flexible substrate; or a dimensionally stable flexible substrate that has a high temperature releasing adhesive layer on a side thereof opposite to the layer of wafer supporting adhesive. The semiconductor wafer support arrangement wherein the wafer supporting adhesive is: pressure sensitive at a temperature of about 20-30° C.; or dry to the touch at a temperature of about 20-30° C. and is melt bondable to the semiconductor wafer at a temperature of about 100-200° C. The semiconductor wafer support arrangement wherein the layer of wafer supporting adhesive includes: a layer of a UV releasing adhesive and a layer of peel releasing adhesive for adhering to the semiconductor wafer; or a layer of a thermal releasing adhesive and a layer of peel releasing adhesive for adhering to the semiconductor wafer. The semiconductor wafer support arrangement for use with a semiconductor wafer having features of up to a given height on a front surface thereof, wherein the layer of adhesive has a thickness that is more than about 2.0 times the given height of the features on the semiconductor wafer.

A semiconductor wafer support arrangement for processing a semiconductor wafer including an adhesive sheet may comprise: a layer of wafer supporting adhesive supported by a substrate, the wafer supporting adhesive thereof having at least 100 gm/25 mm peel strength and/or at least 10 psi die shear at a temperature of about 20-50° C.; wherein the wafer supporting adhesive withstands exposure to a temperature of about 200° C. or higher for at least 3 minutes without decomposition; and has a stronger adhesion to the substrate than to a semiconductor wafer; wherein the wafer supporting adhesive outgasses less than about 0.5% by weight under a high vacuum; wherein the layer of adhesive leaves substantially 0% residual adhesive on the semiconductor wafer after removal therefrom; and where the wafer support arrangement is for use with a semiconductor wafer having features of up to a given height on a front surface thereof to be in contact with the wafer supporting adhesive, the layer of wafer supporting adhesive has a thickness that is more than about 1.5 times the given height of the features of the semiconductor wafer; the semiconductor wafer support arrangement wherein the substrate is formed of a material that is dimensionally stable at a temperature of about 200° C. or higher with a total thickness variation of less than about 5 microns and includes a rigid carrier or a dimensionally stable flexible carrier, and wherein: (a) the wafer supporting adhesive is a single layer that releases from the semiconductor wafer when exposed to a predetermined amount of thermal and/or UV energy, or (b) the wafer supporting adhesive has plural layers of which the layer facing the semiconductor wafer releases from the semiconductor wafer when exposed to a predetermined amount of thermal and/or UV energy, or (c) the wafer supporting adhesive has mechanical strength and flexibility at ambient temperature after processing the semiconductor wafer to release from the semiconductor wafer by peeling. The semiconductor wafer support arrangement may further comprise: a layer of high temperature adhesive supported on the wafer supporting adhesive layer, the high temperature adhesive having at least 100 gm/25 mm peel strength and/or at least 10 psi die shear at a temperature of about 20-50° C. The semiconductor wafer support arrangement wherein the high temperature adhesive loses at least about 80% of its peel strength on its side facing the semiconductor wafer when exposed to a predetermined amount of thermal energy and/or UV energy. The semiconductor wafer support arrangement wherein the substrate includes the dimensionally stable flexible carrier, the dimensionally stable flexible carrier having the wafer supporting adhesive layer on a first side thereof, and further comprising: a layer of high temperature adhesive supported on a second side of the dimensionally stable flexible carrier, the high temperature adhesive having at least 100 gm/25 mm peel strength and/or at least 10 psi die shear at a temperature of about 20-50° C. The semiconductor wafer support arrangement wherein the high temperature adhesive loses at least about 80% of its peel strength on its side facing the semiconductor wafer when exposed to a predetermined amount of thermal energy and/or UV energy. The semiconductor wafer support arrangement wherein the substrate is formed of a material that is dimensionally stable up to a temperature of about 200° C. or higher with a total thickness variation of less than about 2 microns. The semiconductor wafer support arrangement wherein the adhesive withstands exposure to a temperature of about 350° C. for at least 3 minutes without decomposition and has a stronger adhesion to the substrate than to a semiconductor wafer. The semiconductor wafer support arrangement wherein the layer of adhesive loses at least about 80% of its peel strength to the semiconductor wafer when exposed to a predetermined amount of thermal energy and/or UV energy. The semiconductor wafer support arrangement wherein the layer of adhesive loses at least about 95% of its peel strength to the semiconductor wafer when exposed to a predetermined amount of thermal energy and/or UV energy. The semiconductor wafer support arrangement wherein the substrate includes: a dimensionally stable flexible substrate; or a dimensionally stable flexible substrate that has a high temperature releasing adhesive layer on a side thereof opposite to the layer of wafer supporting adhesive. The semiconductor wafer support arrangement wherein the wafer supporting adhesive is: pressure sensitive at a temperature of about 20-30° C.; or dry to the touch at a temperature of about 20-30° C. and is melt bondable to the semiconductor wafer at a temperature of about 100-200° C. The semiconductor wafer support arrangement wherein the layer of wafer supporting adhesive includes: a layer of a UV releasing adhesive and a layer of peel releasing adhesive for adhering to the semiconductor wafer; or a layer of a thermal releasing adhesive and a layer of peel releasing adhesive for adhering to the semiconductor wafer. The semiconductor wafer support arrangement for use with a semiconductor wafer having features of up to a given height on a front surface thereof, wherein the layer of adhesive has a thickness that is more than about 2.0 times the given height of the features on the semiconductor wafer.

A method including the wafer processing adhesive sheet for processing a semiconductor wafer, wherein the method may comprise: obtaining a semiconductor wafer having a back side and having front side on which electronic circuits and/or other features may be formed; attaching the front side of the semiconductor wafer to a wafer processing adhesive side of the adhesive sheet; when the adhesive sheet does not include a substrate, attaching the opposite side thereof to a carrier substrate; processing the back side of the semiconductor wafer; and releasing the semiconductor wafer from the adhesive sheet, or releasing the carrier substrate from the adhesive sheet and releasing the semiconductor wafer from the adhesive sheet. The method wherein releasing the semiconductor wafer includes: peeling the adhesive sheet away from the semiconductor wafer; or applying thermal energy and/or UV energy to the adhesive sheet and peeling the adhesive sheet away from the semiconductor wafer; or applying thermal energy and/or UV energy to the adhesive sheet, removing the carrier substrate from the adhesive sheet and then peeling the adhesive sheet away from the semiconductor wafer.

As used herein, the term "about" means that dimensions, sizes, formulations, parameters, shapes and other quantities and characteristics are not and need not be exact, but may be approximate and/or larger or smaller, as desired, reflecting tolerances, conversion factors, rounding off, measurement error and the like, and other factors known to those of skill in the art. In general, a dimension, size, formulation, parameter, shape or other quantity or characteristic is "about" or "approximate" whether or not expressly stated to be such. It is noted that embodiments of very different sizes, shapes and dimensions may employ the described arrangements.

Although terms such as "front," "back," "rear," "side," "end," "top," "bottom," "up," "down," "left," "right," "upward," "downward," "forward," "backward," "under" and/or "over," "vertical," "horizontal," and the like may be used herein as a convenience in describing one or more embodiments and/or uses of the present arrangement, the articles described may be positioned in any desired orientation and/or may be utilized in any desired position and/or orientation. Such terms of position and/or orientation should be understood as being for convenience only, and not as limiting of the invention as claimed.

As used herein, the term "and/or" encompasses both the conjunctive and the disjunctive cases, so that a phrase in the form "A and/or B" encompasses "A" or "B" or "A and B." In addition, the term "at least one of" one or more elements is intended to include one of any one of the elements, more than one of any of the elements, and two or more of the elements up to and including all of the elements, and so, e.g., the phrase in the form "at least one of A, B and C" includes "A," "B," "C," "A and B," "A and C," "B and C," and "A and B and C."

While various operations, steps and/or elements of a process or method or operation may be described in an order or sequence, the operations, steps and/or elements may not need to be performed in that order or sequence, or in any particular order or sequence, unless expressly stated to require a particular order or sequence.

While the present invention has been described in terms of the foregoing example embodiments, variations within the scope and spirit of the present invention as defined by the claims following will be apparent to those skilled in the art. For example, the described wafer processing adhesives and sheets may be employed with any diameter semiconductor wafer and/or wafer material, e.g., from the original 25 mm and 50 mm diameter wafers to the 300 mm wafers currently in use, and to even larger wafers, e.g., 450 mm wafers, that may come to be used.

While certain features may be described as a raised feature, e.g., a ridge, boss, flange, projection, detent, or other raised feature, such feature may be positively formed or may be what remains after a recessed feature, e.g., a groove, slot, hole, indentation, recess, detent, or other recessed feature, is made. Similarly, while certain features may be described as a recessed feature, e.g., a groove, slot, hole, indentation, recess or other recessed feature, such feature may be positively formed or may be what remains after a raised feature, e.g., a ridge, boss, flange, projection or other raised feature, is made. In addition, where a raised feature engages a recessed feature, such as a cylindrical projection that engages a complementary receptacle, the relative positions of the raised and recessed features may be interchanged or other wise modified.

Each of the U.S. Provisional Applications, U.S. Patent Applications, and/or U.S. Patents, identified herein is hereby incorporated herein by reference in its entirety, for any purpose and for all purposes irrespective of how it may be referred to or described herein.

Finally, numerical values stated are typical or example values, are not limiting values, and do not preclude substantially larger and/or substantially smaller values. Values in any given embodiment may be substantially larger and/or may be substantially smaller than the example or typical values stated.

What is claimed is:

1. A semiconductor wafer support arrangement for processing a semiconductor wafer including an adhesive sheet comprising:
    a layer of wafer supporting adhesive supported by a substrate, the wafer supporting adhesive thereof having at least 100 gm/25 mm peel strength and/or at least 10 psi die shear at a temperature of about 20-50° C.;
    wherein the layer of wafer supporting adhesive withstands exposure to a temperature of about 200° C. or higher for at least 3 minutes without decomposition; and has a stronger adhesion to the substrate than to the semiconductor wafer;
    wherein the layer of wafer supporting adhesive outgasses less than about 0.5% by weight under a high vacuum;
    wherein the layer of wafer supporting adhesive leaves substantially 0% residual adhesive on the semiconductor wafer after removal therefrom; and
    where the wafer support arrangement is for use with a wafer having features of up to a given height on a front surface thereof to be in contact with the layer of wafer supporting adhesive, the layer of wafer supporting adhesive having a thickness that is more than about 1.5 times the given height of the features of the wafer;
    the semiconductor wafer support arrangement wherein the substrate is formed of a material that is dimensionally stable at a temperature of about 200° C. or higher with a total thickness variation of less than about 5 microns and
    (a) the substrate is flexible and has flatness sufficient to stay on a holding chuck having a surface flatness tolerance of less than about 5 microns; and/or
    (b) the substrate has stronger adhesion to the layer of wafer supporting adhesive than the wafer supporting adhesive has to the semiconductor wafer.

2. The semiconductor wafer support arrangement of claim 1 further comprising:
    a layer of high temperature adhesive supported on the layer of wafer supporting adhesive, the high temperature adhesive having at least 100 gm/25 mm peel strength and/or at least 10 psi die shear at a temperature of about 20-50° C.

3. The semiconductor wafer support arrangement of claim 2 wherein the layer of high temperature adhesive loses at least about 80% of its peel strength on its side facing the semiconductor wafer when exposed to a predetermined amount of thermal energy and/or UV energy.

4. The semiconductor wafer support arrangement of claim 1 wherein the substrate includes a dimensionally stable flexible carrier, the dimensionally stable flexible carrier having the layer of wafer supporting adhesive on a first side thereof, and further comprising:
a layer of high temperature adhesive supported on a second side of the dimensionally stable flexible carrier, the high temperature adhesive having at least 100 gm/25 mm peel strength and/or at least 10 psi die shear at a temperature of about 20-50° C.

5. The semiconductor wafer support arrangement of claim 4 wherein the layer of high temperature adhesive loses at least about 80% of its peel strength on its side facing the semiconductor wafer when exposed to a predetermined amount of thermal energy and/or UV energy.

6. The semiconductor wafer support arrangement of claim 1 wherein the substrate is formed of a material that is dimensionally stable up to a temperature of about 200° C. or higher with a total thickness variation of less than about 2 microns.

7. The semiconductor wafer support arrangement of claim 1 wherein the wafer supporting adhesive withstands exposure to a temperature of about 350° C. for at least 3 minutes without decomposition and has a stronger adhesion to the substrate than to the semiconductor wafer.

8. The semiconductor wafer support arrangement of claim 1 wherein the layer of adhesive loses at least about 80% of its peel strength to the semiconductor wafer when exposed to a predetermined amount of thermal energy and/or UV energy.

9. The semiconductor wafer support arrangement of claim 1 wherein the layer of adhesive loses at least about 95% of its peel strength to the semiconductor wafer when exposed to a predetermined amount of thermal energy and/or UV energy.

10. The semiconductor wafer support arrangement of claim 1 wherein the substrate includes:
a dimensionally stable flexible substrate; or
a dimensionally stable flexible substrate that has a high temperature releasing adhesive layer on a side thereof opposite to the layer of wafer supporting adhesive.

11. The semiconductor wafer support arrangement of claim 1 wherein the wafer supporting adhesive is:
pressure sensitive at a temperature of about 20-30° C.; or
dry to the touch at a temperature of about 20-30° C. and is melt bondable to the semiconductor wafer at a temperature of about 100-200° C.

12. The semiconductor wafer support arrangement of claim 1 wherein the layer of wafer supporting adhesive includes:
a layer of a UV releasing adhesive and a layer of peel releasing adhesive for adhering to the semiconductor wafer; or
a layer of a thermal releasing adhesive and a layer of peel releasing adhesive for adhering to the semiconductor wafer.

13. The semiconductor wafer support arrangement of claim 1 for use with a wafer having features of up to a given height on a front surface thereof, wherein the layer of adhesive has a thickness that is more than about 2.0 times the given height of the features on the wafer.

14. A method including the wafer processing adhesive sheet of claim 1 for processing a semiconductor wafer, the method comprising:
obtaining a semiconductor wafer having a back side and having a front side on which electronic circuits and/or other features may be formed;
attaching the front side of the semiconductor wafer to a wafer processing adhesive side of the adhesive sheet;
when the adhesive sheet does not include a substrate, attaching the opposite side thereof to a carrier substrate;
processing the back side of the semiconductor wafer; and
releasing the semiconductor wafer from the adhesive sheet, or
releasing the carrier substrate from the adhesive sheet and releasing the semiconductor wafer from the adhesive sheet.

15. The method of claim 14 wherein releasing the semiconductor wafer includes:
peeling the adhesive sheet away from the semiconductor wafer; or
applying thermal energy and/or UV energy to the adhesive sheet and peeling the adhesive sheet away from the semiconductor wafer; or
applying thermal energy and/or UV energy to the adhesive sheet, removing the carrier substrate from the adhesive sheet and then peeling the adhesive sheet away from the semiconductor wafer.

16. The semiconductor wafer support arrangement of claim 1 wherein the substrate includes a disposable substrate.

17. The method of claim 14 wherein the carrier substrate includes a disposable substrate.

18. A semiconductor wafer support arrangement for processing a semiconductor wafer including an adhesive sheet comprising:
a layer of wafer supporting adhesive supported by a substrate, the wafer supporting adhesive thereof having at least 100 gm/25 mm peel strength and/or at least 10 psi die shear at a temperature of about 20-50° C.;
wherein the layer of wafer supporting adhesive withstands exposure to a temperature of about 200° C. or higher for at least 3 minutes without decomposition; and has a stronger adhesion to the substrate than to the semiconductor wafer;
wherein the layer of wafer supporting adhesive outgasses less than about 0.5% by weight under a high vacuum;
wherein the layer of wafer supporting adhesive leaves substantially 0% residual adhesive on the semiconductor wafer after removal therefrom; and
where the wafer support arrangement is for use with a wafer having features of up to a given height on a front surface thereof to be in contact with the layer of wafer supporting adhesive, the layer of wafer supporting adhesive having a thickness that is more than about 1.5 times the given height of the features of the wafer;
the semiconductor wafer support arrangement wherein the substrate is formed of a material that is dimensionally stable at a temperature of about 200° C. or higher with a total thickness variation of less than about 5 microns and includes a rigid carrier or a dimensionally stable flexible carrier, and wherein:
(a) the layer of wafer supporting adhesive is a single layer that releases from the semiconductor wafer when exposed to a predetermined amount of thermal and/or UV energy, or
(b) the layer of wafer supporting adhesive has plural layers of which the layer facing the semiconductor wafer releases from the semiconductor wafer when exposed to a predetermined amount of thermal and/or UV energy, or (c) the layer of wafer supporting adhesive has mechanical strength and flexibility at ambient temperature after processing the semiconductor wafer to release from the semiconductor wafer by peeling.

19. The semiconductor wafer support arrangement of claim 18 further comprising:
a layer of high temperature adhesive supported on the layer of wafer supporting adhesive, the high temperature adhesive having at least 100 gm/25 mm peel strength and/or at least 10 psi die shear at a temperature of about 20-50° C.

20. The semiconductor wafer support arrangement of claim 19 wherein the layer of high temperature adhesive loses at least about 80% of its peel strength on its side facing the semiconductor wafer when exposed to a predetermined amount of thermal energy and/or UV energy.

21. The semiconductor wafer support arrangement of claim 18 wherein the substrate includes the dimensionally stable flexible carrier, the dimensionally stable flexible carrier having the layer of wafer supporting adhesive on a first side thereof, and further comprising:
a layer of high temperature adhesive supported on a second side of the dimensionally stable flexible carrier, the high temperature adhesive having at least 100 gm/25 mm peel strength and/or at least 10 psi die shear at a temperature of about 20-50° C.

22. The semiconductor wafer support arrangement of claim 21 wherein the layer of high temperature adhesive loses at least about 80% of its peel strength on its side facing the semiconductor wafer when exposed to a predetermined amount of thermal energy and/or UV energy.

23. The semiconductor wafer support arrangement of claim 18 wherein the substrate is formed of a material that is dimensionally stable up to a temperature of about 200° C. or higher with a total thickness variation of less than about 2 microns.

24. The semiconductor wafer support arrangement of claim 18 wherein the wafer supporting adhesive withstands exposure to a temperature of about 350° C. for at least 3 minutes without decomposition and has a stronger adhesion to the substrate than to the semiconductor wafer.

25. The semiconductor wafer support arrangement of claim 18 wherein the layer of wafer supporting adhesive loses at least about 80% of its peel strength to the semiconductor wafer when exposed to a predetermined amount of thermal energy and/or UV energy.

26. The semiconductor wafer support arrangement of claim 18 wherein the layer of wafer supporting adhesive loses at least about 95% of its peel strength to the semiconductor wafer when exposed to a predetermined amount of thermal energy and/or UV energy.

27. The semiconductor wafer support arrangement of claim 18 wherein the dimensionally stable flexible carrier has a high temperature releasing adhesive layer on a side thereof opposite to the layer of wafer supporting adhesive.

28. The semiconductor wafer support arrangement of claim 18 wherein the wafer supporting adhesive is:
pressure sensitive at a temperature of about 20-30° C.; or
dry to the touch at a temperature of about 20-30° C. and is melt bondable to the semiconductor wafer at a temperature of about 100-200° C.

29. The semiconductor wafer support arrangement of claim 18 wherein the layer of wafer supporting adhesive includes:
a layer of a UV releasing adhesive and a layer of peel releasing adhesive for adhering to the semiconductor wafer; or
a layer of a thermal releasing adhesive and a layer of peel releasing adhesive for adhering to the semiconductor wafer.

30. The semiconductor wafer support arrangement of claim 18 for use with a wafer having features of up to a given height on a front surface thereof, wherein the layer of wafer supporting adhesive has a thickness that is more than about 2.0 times the given height of the features on the wafer.

31. A method including the wafer processing adhesive sheet of claim 18 for processing a semiconductor wafer, the method comprising:
obtaining a semiconductor wafer having a back side and having front side on which electronic circuits and/or other features may be formed;
attaching the front side of the semiconductor wafer to a wafer processing adhesive side of the adhesive sheet;
when the adhesive sheet does not include a substrate, attaching the opposite side thereof to a carrier substrate;
processing the back side of the semiconductor wafer; and
releasing the semiconductor wafer from the adhesive sheet, or
releasing the carrier substrate from the adhesive sheet and releasing the semiconductor wafer from the adhesive sheet.

32. The method of claim 31 wherein releasing the semiconductor wafer includes:
peeling the adhesive sheet away from the semiconductor wafer; or
applying thermal energy and/or UV energy to the adhesive sheet and peeling the adhesive sheet away from the semiconductor wafer; or
applying thermal energy and/or UV energy to the adhesive sheet, removing the carrier substrate from the adhesive sheet and then peeling the adhesive sheet away from the semiconductor wafer.

33. The method of claim 31 wherein the carrier substrate includes a disposable substrate.

34. The semiconductor wafer support arrangement of claim 18 wherein the substrate includes a disposable substrate.

* * * * *